US 6,679,771 B2

(12) United States Patent
Lee

(10) Patent No.: US 6,679,771 B2
(45) Date of Patent: Jan. 20, 2004

(54) COOLING FAN WITH LIGHT-EMITTING DEVICE

(75) Inventor: Andrew Lee, Fremont, CA (US)

(73) Assignee: Antec, Incorporated, Fremont, CA (US)

( * ) Notice: Subject to any disclaimer, the term of this patent is extended or adjusted under 35 U.S.C. 154(b) by 0 days.

(21) Appl. No.: 10/403,048

(22) Filed: Apr. 1, 2003

(65) Prior Publication Data

US 2003/0190884 A1 Oct. 9, 2003

(30) Foreign Application Priority Data

Apr. 4, 2002 (TW) ..................................... 91204386 U

(51) Int. Cl.[7] ................................................ H05K 5/00
(52) U.S. Cl. ........................................ 454/184; 237/46
(58) Field of Search ................................ 454/184, 254, 454/341; 237/46

(56) References Cited

U.S. PATENT DOCUMENTS 5,063,834 A * 11/1991 Aalto et al. .................... 454/56
5,721,670 A * 2/1998 Cochrane et al. ............ 361/695
5,722,887 A * 3/1998 Wolfson et al. .............. 424/256
5,881,806 A * 3/1999 Rudd .......................... 165/244
5,969,941 A * 10/1999 Cho ............................ 361/687
6,042,474 A * 3/2000 Harvey et al. ............... 454/184
6,285,548 B1 * 9/2001 Hamlet et al. ............... 361/695
6,315,031 B1 * 11/2001 Miyahara et al. ........... 165/80.3

* cited by examiner

Primary Examiner—Derek Boles
(74) Attorney, Agent, or Firm—Fei-Fei Chao; Venable LLP

(57) ABSTRACT

A cooling fan with a light-emitting device has a frame, multiple light-emitting diodes (LEDs), a circuit board, a stator, permanent magnets and an impeller. The permanent magnets are formed around the inside-perimeter of the casing of the impeller. The impeller is rotated by the interaction force between the poles of the electro-magnetized stator and the poles of the permanent magnets in the impeller. The rotational speed of the impeller is controlled by the drive circuitry on the circuit board. Each LED projects light towards the impeller and to the frame so the light will reflects and bounces all over the fan to produce a fantastic visual effect. The LEDs can be made to twinkle based on the rotational speed of the fan to increase the visual attractiveness.

8 Claims, 5 Drawing Sheets

COOLING FAN WITH LIGHT-EMITTING DEVICE

BACKGROUND OF THE INVENTION

1. Field of the Invention

The present invention relates to a cooling fan, and more particularly to a cooling fan with light-emitting device.

2. Description of Related Art

In a computer system, as the CPU speed increases, it dissipates more and more heat to the system. Nowadays the temperature inside a computer gets so high that a cooling fan or multi-cooling fans displacement is needed to protect the system from overheat.

The purpose of a cooling fan is to suck or exhaust the air in or out a computer system thus to cool the components inside the system. The ability to move more air through the fan is the major factor that a fan designer will focus on. A conventional cooling fan is black in color and the appearance of the fan is almost identical to one another in the market in terms of size and structure. When a user searches for a cooling fan for his or her computer, the cooling capacity of the cooling fan will likely be the major factor to consider for.

Nowadays a personal computer (PC) has evolved from a gray ugly box twenty years ago to a multi media consumer electronic product in variety of shapes. It can be designed as a home entertaining center sitting side by side with the audio equipment in the sitting room or it can be a gaming machine with tremendous processing power in tie family room. In either case, the appearance of a PC will play a significant role in attracting buyer' attention. A cooling fan in a PC may be visible and it can be a vital part to the appearance of a PC. In this case a conventional black cooling fan may not serve the purpose well. A cooling fan not only cool the system but also provide attractive look will definitely attract more users to use it. To add visual attractiveness to a cooling fan is one way to attract more users.

SUMMARY OF THE INVENTION

The main objective of the present invention is to provide a means of increasing visual attractiveness of a cooling fan by adding a light-emitting device to it.

A cooling fan with a light-emitting device has a frame, multiple light-emitting diodes (LEDs), a circuit board, a stator, permanent magnets and an impeller. The permanent magnets are formed around a inside-perimeter of the casing of the impeller. The impeller is rotated by the interaction force between poles of the electromagnetized stator and poles of the permanent magnets in the impeller. The rotational speed of the impeller is controlled by drive circuitry on the circuit board. Each LED projects light towards the impeller and to the frame so the light will reflects and bounces all over the fan to produce a fantastic visual effect. The LEDs can be made to twinkle based on the rotational speed of the fan to increase the visual attractiveness.

Further benefits and advantages of the present invention will become apparent after a careful reading of the detailed description with appropriate reference to the accompanying drawings.

DETAILED DESCRIPTION OF THE INVENTION

Figure 1:
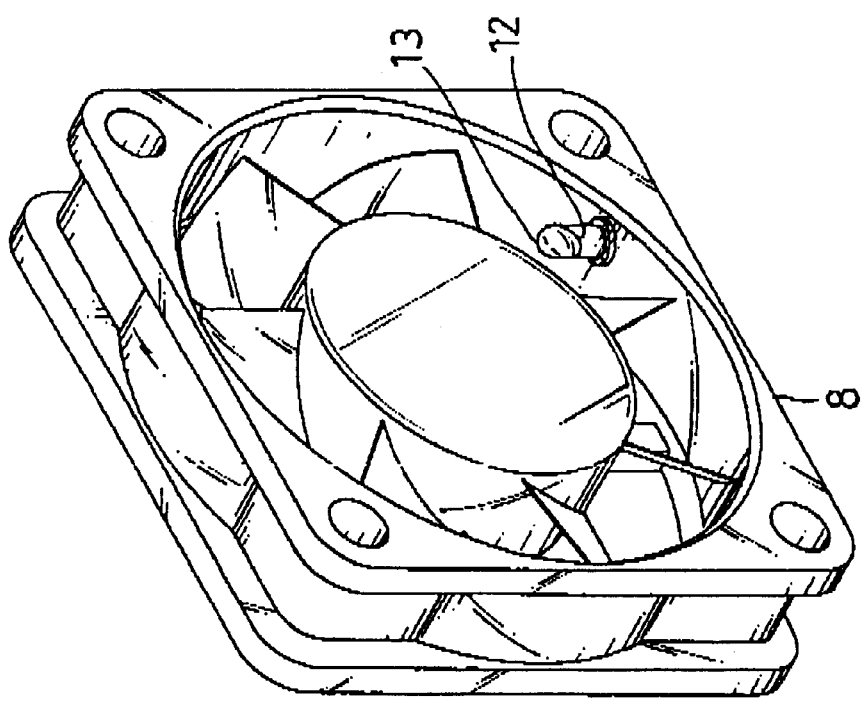
FIG. 1 is a perspective view of a cooling fan with a light-emitting device in accordance with the present invention.
Figure 2:
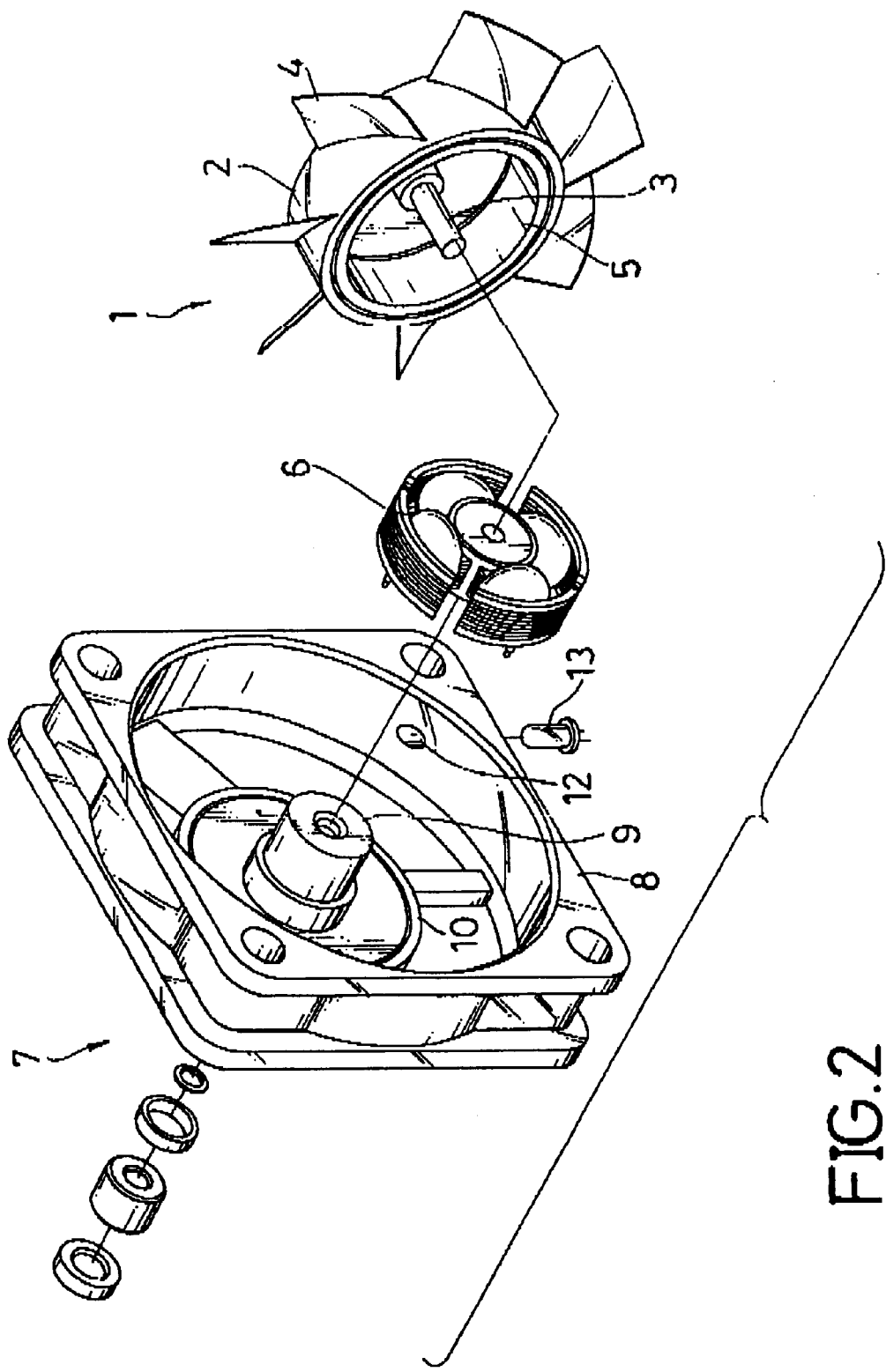
FIG. 2 is an exploded perspective view of the cooling fan in FIG. 1.
Figure 3:
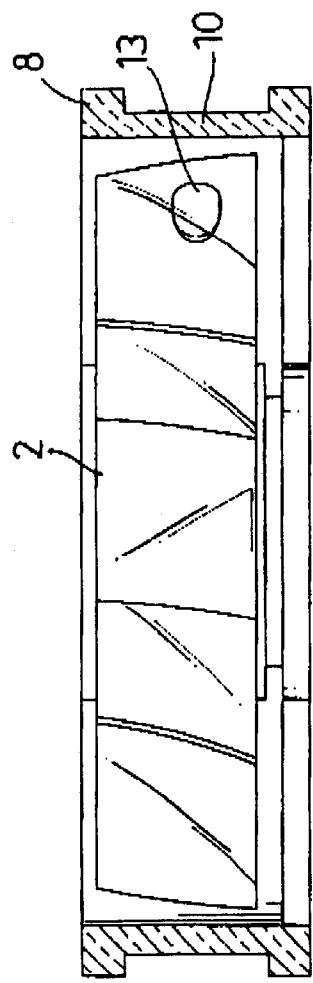
FIG. 3 is a side plan view in partial section of the cooling fan in FIG. 1.
Figure 4:
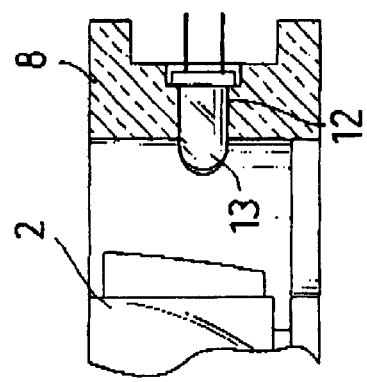
FIG. 4 is a partial side plan view in partial section of the cooling fan in FIG. 1.

With reference to FIGS. 1 to 4, a cooling fan with a light-emitting device in accordance with the present invention comprises a frame (7), multiple light-emitting diodes (LED) (13), a circuit board (10), a stator(6), an impeller (1) and multiple permanent magnets (5). The frame (7) with a center comprises a housing (8) and a stud (9). The housing (8) has multiple LED holes (12) formed in and pass through the housing (8). The stud (9) is perpendicularly extrudes from the center of the frame (8). The impeller (1) with a center comprises a round casing (2), a shaft (3) and multiple blades (4). The casing (2) has an inside-perimeter. The multiple permanent magnets (5) formed around the inside-perimeter of the casing (2) are arc-shaped and each has multiple poles (not shown). The shaft (3) is formed in the center of the impeller (1). The circuit hoard (10) is round in shape with a center portion punched out to go through the stud (9). The stator (6) has multiple coils, which are securely wound around the stud (9) and is electrically connected to the circuit board (10). With the shaft (3) go through the stator (6) and into the stud (9), the impeller (1) sits inside the housing (8) of the frame (7) with the stator (6) completely surround by the permanent magnets (5) inside the casing (2). The impeller (1) is rotated by the interaction force between the magnetic forces generated by the stator (6) and the permanent magnets (5).

Each light-emitting diode (LEDs) (13) is mounted inside one of the LED holes (12) on the housing (8) pointing inwards to the impeller (1). The rotational of the impeller (1) is controlled by a drive circuit (not shown) on the circuit board (10), and the multiple LEDs (13) are powered by the same circuit board (10) or an outside circuit board (not shown). Each LED (13) projects light towards the impeller (1) and to the frame (7) so the light will reflects and bounces all over the fan. When the frame (7) and the impeller (1) are transparent or translucent, the light will produce a fantastic visual effect so the whole fan will glow in the dark.

Figure 5:
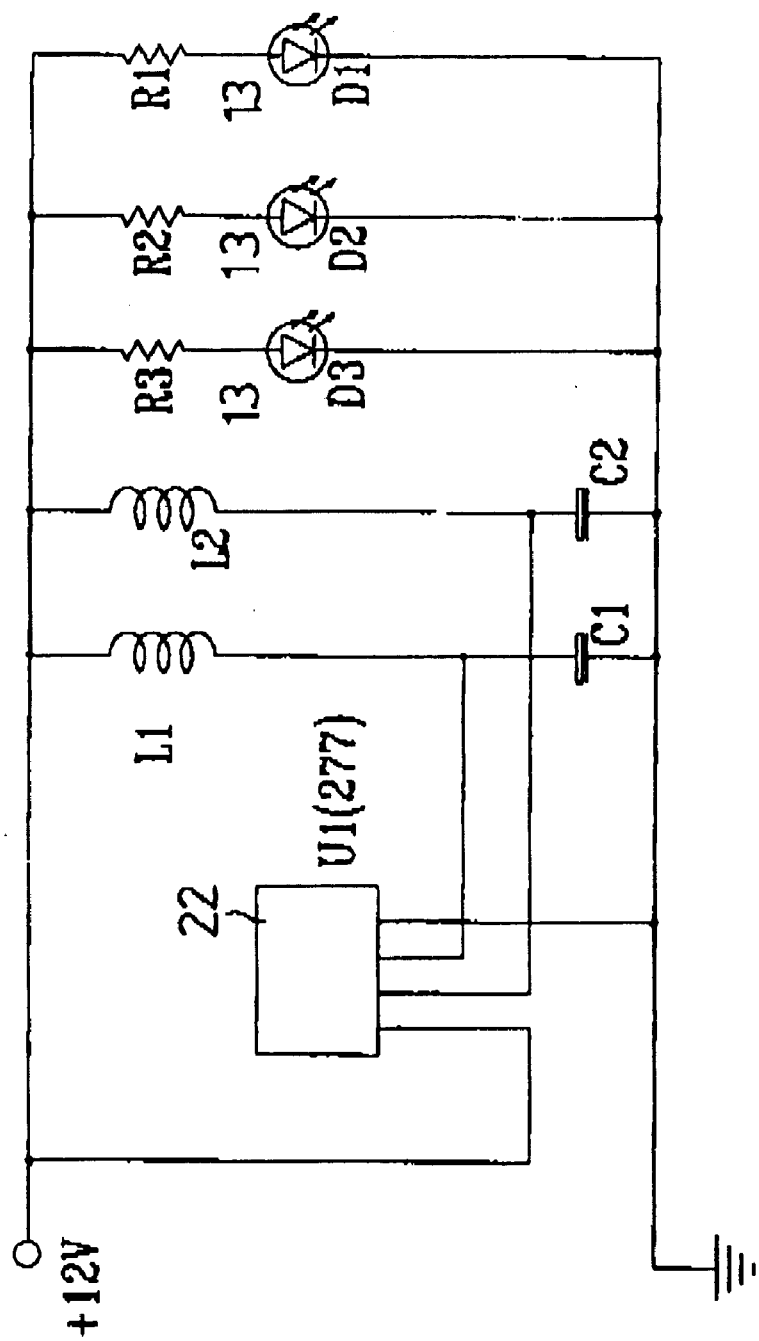
FIG. 5 is a circuit diagram of a first embodiment of a drive circuit for the cooling fan with a light-emitting device in rig. 1.

Please refer to FIG. 5. The LEDs (13) are connected to the same power source connected to the drive circuit that controls the impeller (1). The drive circuit comprises a driving IC (22), a power source (not numbered), stator coils (L1, L2) and isolation capacitors (C1, C2). The driving IC (22) has a power input terminal (not numbered), a ground terminal (not numbered) and two input terminals (not numbered). The power input terminal is connected a power unit (not numbered), and the input terminals are connected respectively to the stator coils (L1, L2). The power source provides the power to the driving IC (22), and the driving IC (22) will control the two input terminals to selectively allow electricity to flow through the stator coils (L1, L2) and switch the electromagnetic poles in the stator (6). The isolation capacitors (C1, C2) will provide discharge, charge and wave filter function. The power unit is also connected to the multiple LEDs (13) so when the power rotates the fan (1) and the LEDs (13) illuminate.

Figure 6:
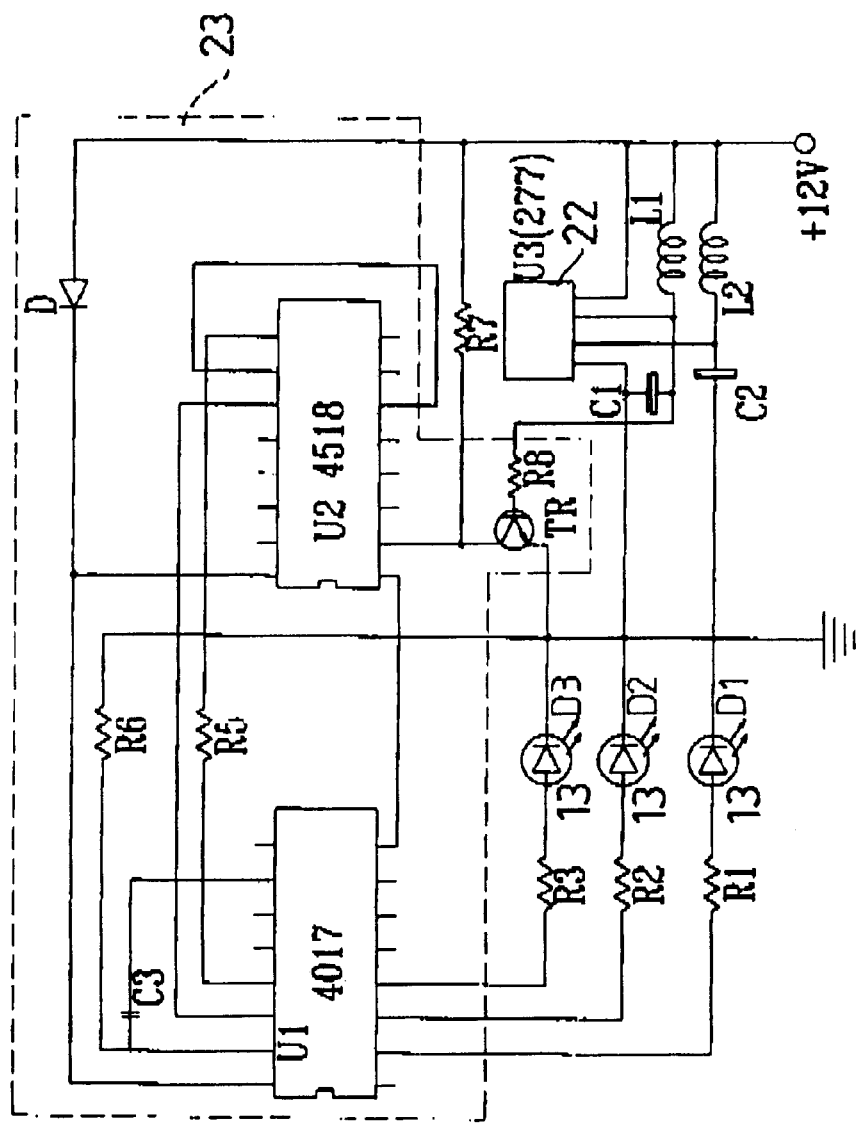
FIG. 6 is a circuit diagram of a second embodiment of a drive circuit for the cooling fan with a light-emitting device in FIG. 1.

With reference to FIG. 6, the LEDs (13) can be made to twinkle or blink corresponding to the rotational speed of the impeller (1) by adding a twinkle control circuit (23) to the drive circuit. The rotation of the impeller (1) is controlled by the driving IC (22) by switching the flow of electricity to each coil (L1, L2), and the driving IC (22) is connected to a twinkled control circuit (23). The twinkled control circuit (23) consists of a transistor (TR), a counter (U2) and a decoder (U1). The transistor (TR) has base, collector and emitter. The base of the transistor (TR) is connected to the driving IC (22), the collector of the transistor (TR) is connected to the counter (U2) and the emitter of the transistor (TR) is connected to ground. The counter (U2) is connected to the decoder (U1) and multiple output terminals of the decoder (U1), which are connected respectively to an anode of the LEDs (13). When the driving IC (22) is operating and outputting to the transistor (TR), the transistor (TR) will receive the signal of the rotational speed of the impeller (1) and make a pulse signal to the counter (U2). The counter (U2) produces a pulse signal to the decoder (U1), and then the decoder (U1) decodes the signals from the counter (U2) and causes the LEDs (13) to twinkle. The twinkle control circuit (23) responds based on the rotational speed of the impeller (1) to determine the frequency at which the LEDs (13) twinkled. The design will give the cooling fan a distinctive vision effect and more variation. Furthermore, the drive circuit can be designed to provide a warning signal if the cooling fan breaks down.

Besides the embedded drive circuit described above, the LEDs (13) can also be controlled by an outside drive circuit.

Although the invention has been explained in relation to its preferred embodiment, many other possible modifications and variations can be made without departing from the spirit and scope of the invention as hereinafter claimed.

What is claimed is:

1. A cooling fan with a light-emitting device comprising:
    a frame with a center having
        a housing having multiple LED holes formed in and pass through the housing; and
        a stud perpendicularly extruded from the center of the frame;
    a circuit board with a center portion punched out to go through the stud;
    a stator mounted around the stud;
    an impeller with a center having
        a casing with an inside-perimeter; and
        a shaft formed in the center of the impeller and extending through the stator to the stud;
    multiple permanent magnets formed around the inside-perimeter of the casing and each having multiple poles;
    a drive circuit embedded on the circuit board and electrically connected to the stator to control the rotation of the impeller; and
    a light-emitting diode (LED) mounted in each of the LED hole and electrically connected to and controlled by the drive circuit.

2. The cooling fan with a light-emitting device as claimed in claim 1, wherein the drive circuit consists of a power source and a driving IC where the power source is connected to the driving IC and the coils of the stator, and the driving IC is connected to the coils of the stator to control electricity to the stator coils, and each of the LED is connected to the power source.

3. The cooling fan with a light-emitting device as claimed in claim 1, wherein the drive circuit consists of
    a power source connected to a driving IC and the coils of the stator;
    a driving IC connected to the coils of the stator to control electricity to the stator coils; and
    a twinkled control circuit connected to the driving IC and comprising:
        a transistor connected to the driving IC;
        a counter having an input terminal connected to the transistor and multiple output terminals; and
        a decoder having multiple input terminal each connected to one of the multiple output terminals of the counter and multiple output terminals each connected to one of the LEDs.

4. The cooling fan with a light-emitting device as claimed in claim 1 further consists of an outside drive circuit connected to the LEDs.

5. The cooling fan with a light-emitting device as claimed in claim 1, wherein the casing is made of plastic.

6. The cooling fan with light-emitting device as claimed in claim 5, wherein the casing is transparent.

7. The cooling fan with light-emitting device as claimed in claim 5, wherein the casing is translucent.

8. The cooling fan with light-emitting device as claimed in claim 5, wherein the casing is multicolored.

* * * * *

(12) EX PARTE REEXAMINATION CERTIFICATE (5893rd)
United States Patent
Lee

(10) Number: US 6,679,771 C1
(45) Certificate Issued: Sep. 18, 2007

(54) COOLING FAN WITH LIGHT-EMITTING DEVICE

(75) Inventor: Andrew Lee, Fremont, CA (US)

(73) Assignee: Antec, Inc., Fremont, CA (US)

Reexamination Request:
No. 90/007,934, Feb. 13, 2006

Reexamination Certificate for:
Patent No.: 6,679,771
Issued: Jan. 20, 2004
Appl. No.: 10/403,048
Filed: Apr. 1, 2003

(30) Foreign Application Priority Data

Apr. 4, 2002 (TW) .................................. 91204386 U

(51) Int. Cl.
*H05K 5/00* (2006.01)

(52) U.S. Cl. .......................................... 454/184; 237/46
(58) Field of Classification Search .................. 454/184, 454/254, 341; 237/46
See application file for complete search history.

(56) References Cited

U.S. PATENT DOCUMENTS

| | | | | |
|---|---|---|---|---|
| 4,861,237 A | * | 8/1989 | Shiraki et al. | 417/353 |
| 6,102,675 A | * | 8/2000 | Hsieh | 417/423.13 |
| 6,129,528 A | * | 10/2000 | Bradbury et al. | 417/423.1 |
| 6,790,003 B1 | * | 9/2004 | Hu et al. | 416/5 |
| 7,037,073 B2 | * | 5/2006 | Lin | 416/5 |
| 2003/0231956 A1 | * | 12/2003 | Lin | 415/118 |

OTHER PUBLICATIONS

Robert J. Brown, "333 More Science Tricks & Experiements", 1984 published on 1984 by TAB Books in U.S., ISBN 0–8306–1835–X.
Posting of SANDY dated Aug. 20, 2001 at http://www.moddin.net, entitled "LED Fan Mod".
Posting of TIGGERMAN on Mar. 15, 2002 in http://www.moddin.net, entitled "Rainbow Fan Mod".
Catalog of Tiger Electronics, distributed out in CeBit show in Hannover, Germany during Mar. 13, 2002–Mar. 20, 2002, incl. cover page, p. 6, and bottom page.
Posting of GREENPSYCHO dated Apr. 17, 2004 on http://moddershaq.net, "The Moddler's Timeline" and "Composite Timeline".

* cited by examiner

*Primary Examiner*—Sara Clarke

(57) ABSTRACT

A cooling fan with a light-emitting device has a frame, multiple light-emitting diodes (LEDs), a circuit board, a stator, permanent magnets and an impeller. The permanent magnets are formed around the inside-perimeter of the casing of the impeller. The impeller is rotated by the interaction force between the poles of the electromagnetized stator and the poles of the permanent magnets in the impeller. The rotational speed of the impeller is controlled by the drive circuitry on the circuit board. Each LED projects light towards the impeller and to the frame so the light will reflects and bounces all over the fan to produce a fantastic visual effect. The LEDs can be made to twinkle based on the rotational speed of the fan to increase the visual attractiveness.

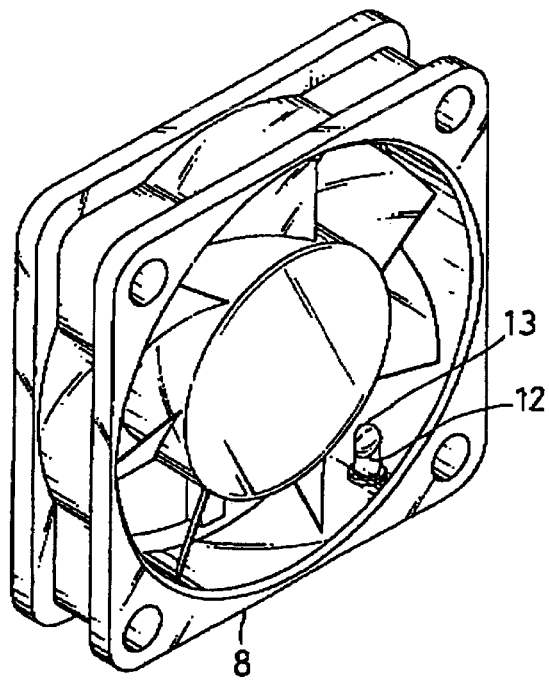

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 3 and 4 is confirmed.

Claims 1, 2 and 5-8 are cancelled.

\* \* \* \* \*